(12) United States Patent
Lee et al.

(10) Patent No.: US 7,755,739 B2
(45) Date of Patent: Jul. 13, 2010

(54) METHOD FOR MANUFACTURING AN ARRAY SUBSTRATE FOR AN LCD DEVICE, COMPRISING ASHING TWO PHOTORESIST LAYERS AND FORMING A CONTACT HOLE

(75) Inventors: Hye Sun Lee, Seoul (KR); Jae Young Oh, Uiwang-si (KR)

(73) Assignee: LG Display Co., Ltd., Seoul (KR)

( * ) Notice: Subject to any disclaimer, the term of this patent is extended or adjusted under 35 U.S.C. 154(b) by 764 days.

(21) Appl. No.: 11/646,550

(22) Filed: Dec. 28, 2006

(65) Prior Publication Data
US 2007/0166859 A1 Jul. 19, 2007

(30) Foreign Application Priority Data
Dec. 29, 2005 (KR) .................. 10-2005-0132868

(51) Int. Cl.
*G02F 1/1333* (2006.01)
*G02F 1/1343* (2006.01)
*G02F 1/13* (2006.01)

(52) U.S. Cl. .................. 349/187; 349/138; 349/147

(58) Field of Classification Search .......... 349/147, 349/187
See application file for complete search history.

(56) References Cited

U.S. PATENT DOCUMENTS
2005/0270454 A1* 12/2005 Ahn et al. .............. 349/114
* cited by examiner

*Primary Examiner*—Andrew Schechter
*Assistant Examiner*—Charles Chang
(74) *Attorney, Agent, or Firm*—McKenna Long & Aldridge LLP

(57) ABSTRACT

An array substrate for an LCD device and a manufacturing method thereof. The array substrate includes: a gate line, a gate electrode, a gate pad, and a pixel electrode formed on the substrate; a gate insulation layer formed on the substrate to expose the gate line and the pixel electrode; a source electrode connected to a data line crossing the gate line, a drain electrode facing the source electrode with a channel interposed, a data pad formed at one end of the data line, and a capacitor electrode overlapping portions of the pixel electrode and the gate line; a semiconductor layer constituting the channel between the source electrode and the drain electrode; first, second, third, and fourth contact holes formed in the gate pad, the data pad, the capacitor electrode, and the drain electrode, respectively; and first through fourth contact electrodes formed in the first through fourth contact holes, respectively.

14 Claims, 15 Drawing Sheets

METHOD FOR MANUFACTURING AN ARRAY SUBSTRATE FOR AN LCD DEVICE, COMPRISING ASHING TWO PHOTORESIST LAYERS AND FORMING A CONTACT HOLE

This application claims the benefit of Korean Patent Application No. 10-2005-0132868, filed on Dec. 29, 2005, which is hereby incorporated by reference for all purposes as if fully set forth herein.

BACKGROUND OF THE INVENTION

1. Field of the Invention

The present invention relates to a liquid crystal display (LCD) device, and more particularly, to an array substrate for an LCD and a manufacturing method thereof.

2. Discussion of the Related Art

The rapid development of an information-oriented society has generated a need for flat panel displays having characteristics such as a slim profile, light weight, and low power consumption. Liquid crystal display (LCD) devices are under active development for employment as flat panel displays because LCD devices have excellent color reproduction.

Typically, an LCD device includes two substrates each having electrodes on one surface. The two substrates are arranged such that the surfaces having the electrodes thereon face each other, and a liquid crystal (LC) layer is interposed between the two substrates. By applying a voltage across the electrodes, an electric field is generated between the electrodes. The electric field changes the alignment of liquid crystal molecules in the liquid crystal layer thus changing light transmittance through the LCD device to display an image.

LCD devices may be of various types. Active matrix (AM)-LCD devices having thin film transistors (TFTs) and pixel electrodes connected to the TFTs arranged in a matrix are in the limelight because AM-LCD devices have excellent resolution and excel at displaying moving images.

In an LCD device, the pixel electrodes are formed on an array substrate, which is the lower substrate, and a common electrode is formed on a color filter substrate, which is the upper substrate. The LCD device drives the LC molecules using a vertical electric field applied between the upper substrate and the lower substrate. The LCD device has excellent transmittance and aperture ratio characteristics, and the common electrode formed on the upper substrate serves as a ground, so that destruction of an LC cell caused by static electricity can be prevented.

The upper substrate of the LCD device further includes a black matrix (BM) to prevent light leakage occurring through the transmission of light by portions of the LCD device other than the pixel electrodes.

The array substrate, which is the lower substrate of the LCD device, is formed by repeatedly performing photolithographic process including depositing a thin layer of a material and etching the thin layer using a mask. Generally, four or five masks are used, with the number of masks representing the number of photolithographic processes used for manufacturing an array substrate.

A related art array substrate for an LCD device and a manufacturing method thereof will be described with reference to the accompanying drawings.

FIG. 1 is a plan view of an array substrate for a related art LCD device, and FIG. 2 is a cross-sectional view taken along a line I-I' of FIG. 1.

Referring to FIGS. 1 and 2, in the array substrate for the LCD device, a horizontal gate line 121 and a gate electrode 122 extending from the gate line 121 are formed on a transparent insulation substrate 110.

A gate insulation layer 130 is formed on an entire surface of the transparent insulation substrate 110 including the gate line 121 and the gate electrode 122, and an active layer 141 and ohmic contact layers 151 and 152 are sequentially formed on the gate insulation layer 130.

A data line 161 perpendicularly crossing the gate line 121, a source electrode 162 extending from the data line 161, a drain electrode 163 facing a source electrode 162 with the gate electrode 122 interposed therebetween, and a capacitor electrode 165 overlapping the gate line 121 are formed on the ohmic contact layers 151 and 152.

The data line 161, the source and drain electrodes 162 and 163, and the capacitor electrode 165 are covered with a passivation layer 170. The passivation layer 170 has a first contact hole 171 and a second contact hole 172 exposing the drain electrode 163 and the capacitor electrode 165, respectively.

A pixel electrode 181 is formed on a portion of the passivation layer 170 located in a pixel region defined by gate lines and data lines crossing each other. The pixel electrode 181 is connected to the drain electrode 162 and the capacitor electrode 165 via the first and second contact holes 171 and 172.

The array substrate for an LCD device of the related art having the above-described construction can be manufactured through photolithographic processes using five masks. The photolithographic process includes various processes such as cleaning, coating of a photosensitive layer, exposure and development processes, and etching.

When the number of photolithographic processes is reduced, manufacturing time is considerably reduced, manufacturing costs are reduced, and the percentage of manufactured devices having defects is reduced. Accordingly, it is desirable to reduce the number of masks used to manufacture an array substrate.

SUMMARY OF THE INVENTION

Accordingly, the present invention is directed to an array substrate for an LCD device and a manufacturing method thereof that substantially obviate one or more problems due to limitations and disadvantages of the related art.

An advantage of the present invention is to provide an array substrate for an LCD device that simplifies a manufacturing process and reduces the number of masks for manufacturing the LCD device and a manufacturing method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, there is provided an array substrate for an LCD device, the array substrate including: a gate line, a gate electrode, a gate pad, and a pixel electrode formed on the substrate; a gate insulation layer formed on the substrate excluding a portion of the pixel electrode; a source electrode connected to a data line crossing the gate line, a drain electrode facing the source electrode, a data pad formed at one end of the data line, and a capacitor electrode overlapping portions of the pixel electrode and the gate line; a semiconductor pattern including a channel between the source and drain electrodes; first, second, third, and fourth contact holes formed in the gate pad, the data pad, the capacitor electrode, and the drain electrode, respectively; and first, second, third, and fourth contact electrodes formed in the first, second, third, and fourth contact holes.

In another aspect of the present invention, there is provided a method for manufacturing an array substrate for an LCD device, the method including: forming a transparent conductive layer on a substrate; forming a non-transparent conductive layer on the transparent conductive layer; patterning the transparent conductive layer and the non-transparent conductive layer to form a gate line, a gate electrode, a gate pad, and a transparent pixel electrode, wherein the gate line, the gate electrode, and the gate pad each include portions of the non-transparent conductive layer and the transparent conductive layer; sequentially forming a gate insulation layer, a semiconductor layer, and a data metal layer on the substrate; forming a second photoresist pattern having areas of differing thickness on the data metal layer; patterning the gate insulation layer, the semiconductor layer and the data metal layer to form a data line, a data pad, a capacitor electrode and at least one contact hole by using the second photoresist pattern as a mask; forming a contact electrode layer and a third photoresist layer on the second photoresist pattern and ashing the third photoresist to form an ashed third photoresist pattern inside the at least one contact hole; etching the contact electrode layer to form a contact electrode in each of the at least one contact hole using the ashed third photoresist pattern; ashing the second photoresist pattern to expose a portion of the data metal layer and etching the exposed portion of the data metal layer to form a channel between a source electrode connected to the data line and a drain electrode using the second photoresist pattern; and removing the ashed second photoresist pattern and the ashed third photoresist pattern.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention.

In the drawings.

DETAILED DESCRIPTION OF THE ILLUSTRATED EMBODIMENTS

Reference will now be made in detail to an embodiment of the present invention, example of which is illustrated in the accompanying drawings.

Figure 1:
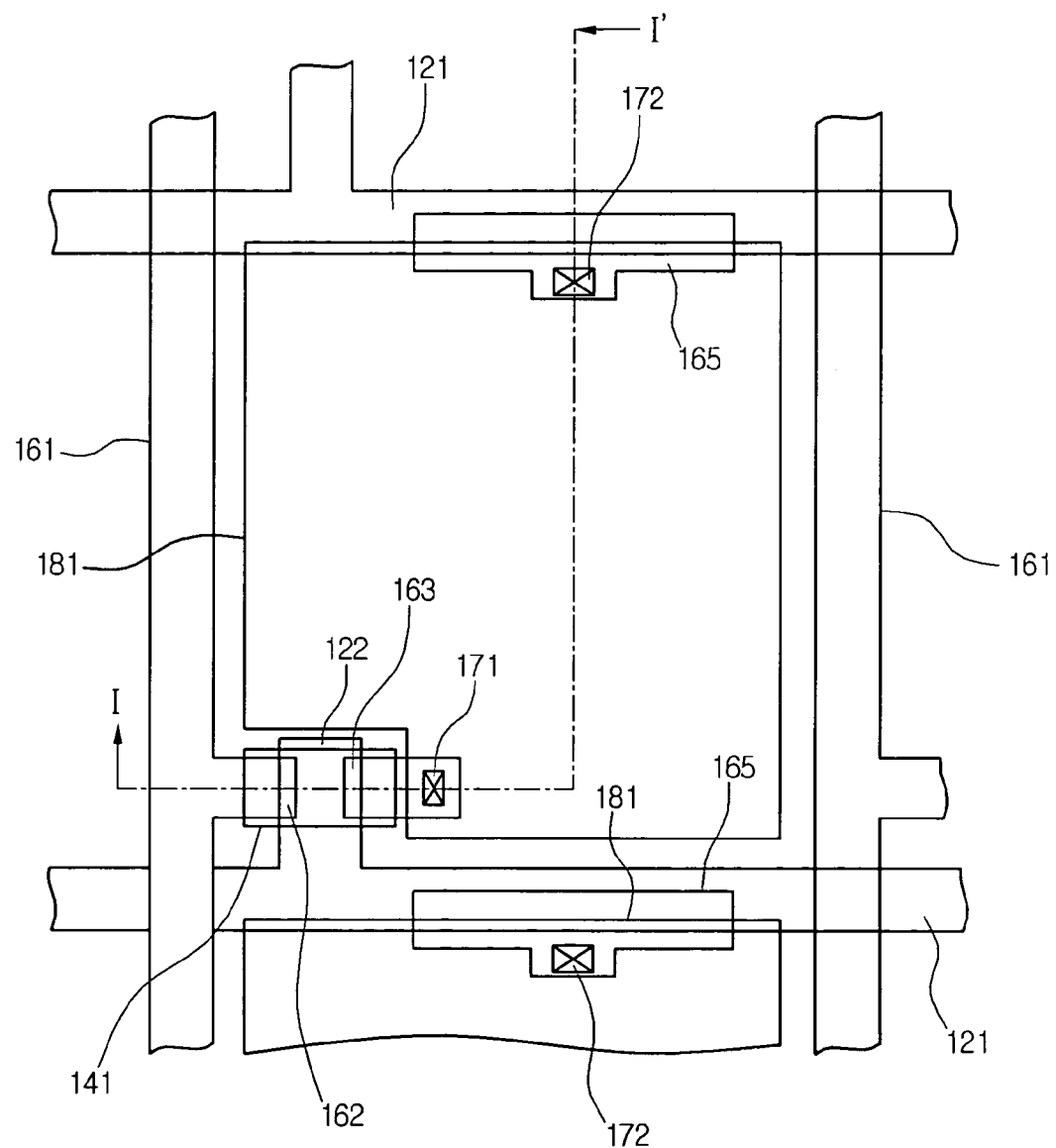
FIG. 1 is a plan view of a related art array substrate for an LCD device.
Figure 2:
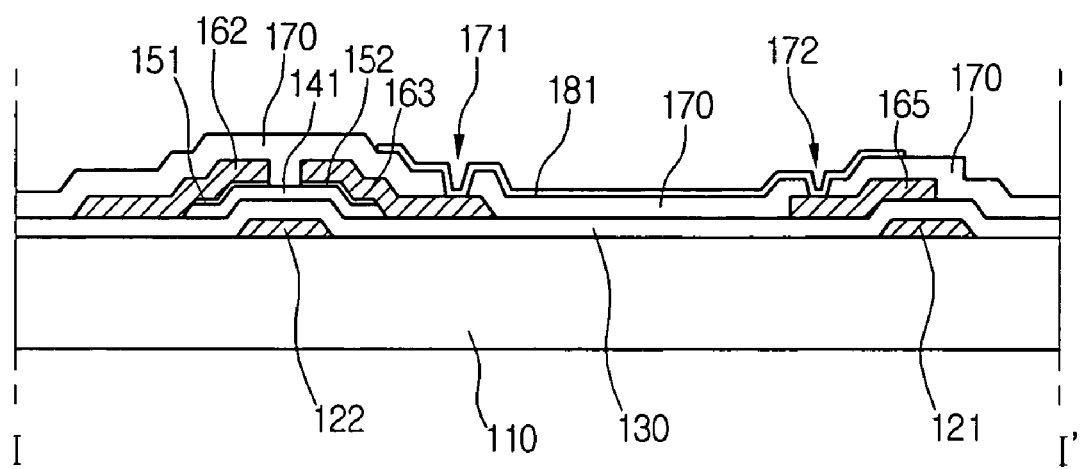
FIG. 2 is a cross-sectional view taken along a line I-I' of FIG. 1.
Figure 3:
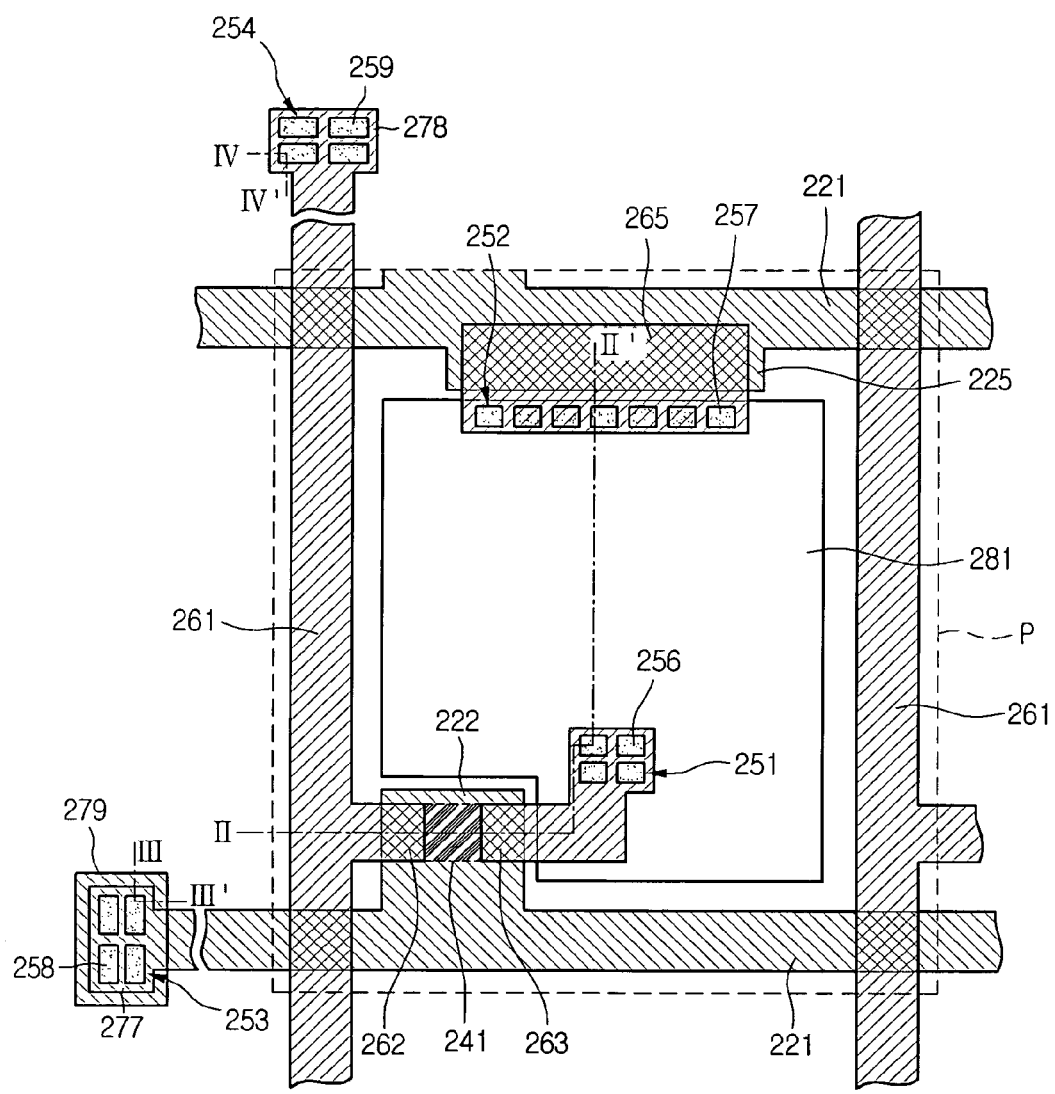
FIG. 3 is a plan view of an LCD device according to the present invention.
Figure 4:
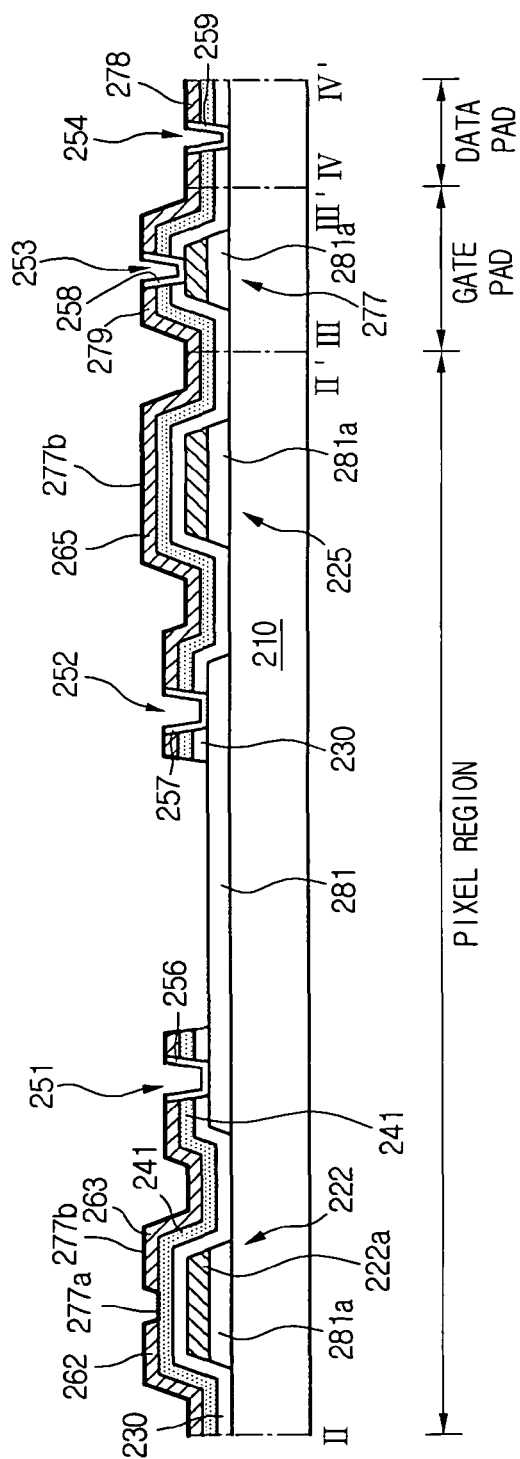
FIG. 4 is a cross-sectional view taken along a line II-II', III-III', and IV-IV' of FIG. 3.

FIG. 3 is a plan view of an LCD device according to the present invention, and FIG. 4 is a cross-sectional view taken along a line II-II', III-III', and IV-IV' of FIG. 3.

Referring to FIGS. 3 and 4, an array substrate for an LCD device according to an embodiment of the present invention includes a gate line 221 horizontally arranged on a transparent insulation substrate 210, and a gate electrode 222 extending from the gate line 221.

A pixel electrode 281 is formed on a layer where the gate line 221 is formed.

The gate line 221 and the gate electrode 222 are formed by stacking a non-transparent conductive layer 222a on transparent electrode patterns 281a.

The pixel electrode 281 is a transparent conductive electrode. The pixel electrode 281 can be formed of a transparent conductive material having excellent light transmittance such as indium-tin-oxide (ITO) or indium-zinc-oxide (IZO). The non-transparent conductive layer 222a can be formed of metal selected from the group consisting of Cu, Al, AlNd, Mo, Cr, Ti, Ta, and MoW.

A gate pad 277 extends from the gate line 221. The gate pad 277 is formed by stacking a non-transparent conductive layer 222a on transparent electrode patterns 281a. Stacked patterns of a semiconductor layer 241 and a data metal layer pattern 279 are formed on the gate pad 277 in an island shape with a gate insulation layer 230 interposed. A gate pad contact hole 253 formed in the semiconductor layer 241 and the data metal layer pattern 279 to expose the non-transparent conductive layer 222a. The semiconductor layer 241 and the data metal layer pattern 279 each side-contacts a gate pad contact electrode 258 contacting the gate pad 277 via the gate pad contact hole 253.

By stating that the semiconductor layer 241 and the data metal layer 260 side-contacts the gate pad 277 side-contacts it is meant that lateral sides of the semiconductor layer 241 and the data metal layer 260 formed by the gate pad contact hole 253 each contacts the gate pad 277 via the gate pad contact electrode 258.

The semiconductor layer 241 has a structure wherein a semiconductor layer formed of an amorphous silicon (a-Si) layer and a semiconductor layer formed by implanting impurity ions are sequentially stacked.

In addition, a data line 261 crosses the gate line 221 to define a pixel region P. A source electrode 262 extending from the data line 261, a drain electrode 263 facing the source electrode 262 with a gate electrode 222 interposed, and a capacitor electrode 265 overlapping the gate line 221 are formed in the pixel region P.

A storage capacitor is formed on a portion between the capacitor electrode 265 and a capacitor lower electrode 225 formed of a region extending from the gate line 221.

The drain 263 side-contacts the pixel electrode 281 via a drain contact hole 251 passing through the gate insulation layer 230. The pixel electrode 281 and the drain electrode 263 contact a drain contact electrode 256 via the drain contact hole 251.

The data line 261, the capacitor electrode 265, the source electrode 262, and the drain electrode 263 are collectively formed using diffraction exposure after the semiconductor layer 241 and the data metal layer 260 are sequentially stacked. The semiconductor layer 241 is formed under the data line 261, and a predetermined portion of the data metal layer 260 is removed between the source and drain electrodes 262 and 263 to expose a portion of the semiconductor layer 241 and thus form a channel.

A portion of the capacitor electrode 265 overlaps a predetermined portion of the gate line 221 and another portion of the capacitor electrode 265 is formed over the pixel electrode 281 with the gate insulation layer 230 interposed.

The pixel electrode 281 side-contacts the capacitor electrode 265 via the capacitor contact hole 252 passing through the gate insulation layer 230 and the semiconductor layer 241.

The pixel electrode 281 and the capacitor electrode 265 each side-contact a capacitor contact electrode 257 via the capacitor contact hole 252. As a result, a storage capacitor is formed on a portion of the gate insulation layer 230 that is located between the capacitor electrode 265 and the gate line 221.

A data pad 278 is formed at one end of the data line 261 when the data line 261 is formed. The data pad 278 is formed by stacking the semiconductor layer 241 and the data metal layer 260, and has a data pad contact hole 254 passing through the gate insulation layer 230, the semiconductor layer 241, and the data metal layer 260. A data pad contact electrode 259 is formed inside the data pad contact hole 254 to allow the data metal layer 260 to side-contact the data pad contact electrode 259.

The drain contact electrode 256, the capacitor contact electrode 257, the gate pad contact electrode 258, and the data pap upper electrode are formed of a transparent conductive material such as ITO and IZO.

The data metal layer 260 can be formed of a material selected from the group consisting of Cu, Al, AlNd, Mo, Cr, Ti, Ta, and MoW.

The semiconductor layer 241 doped with impurities is etched, and a channel passivation layer 277a is formed on the channel formed between the source electrode 262 and the drain electrode.

In addition, an oxide layer 277b is further formed on the source electrode 262, the drain electrode 263, the data line 261, the capacitor electrode 265, and the data metal layer 260 of the gate pad 277.

FIGS. 5A to 5K are views illustrating a process for manufacturing an array substrate for an LCD device according to an embodiment of the present invention, showing cross-sections corresponding to a line II-II', III-III', and IV-IV' of FIG. 3.

Figure 5A:
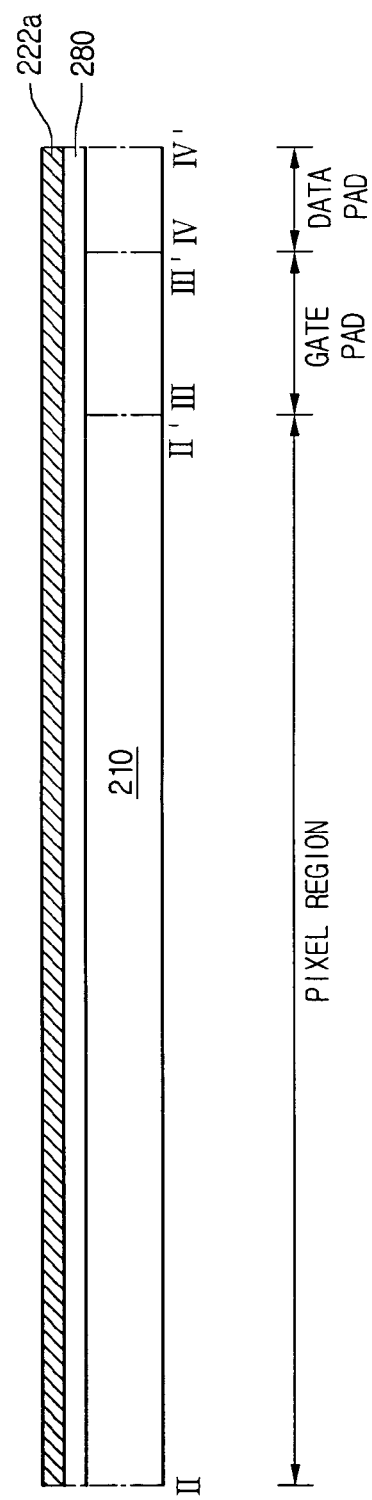
FIGS. 5A to 5K are views illustrating a process for manufacturing an array substrate for an LCD device.
Figure 5B:
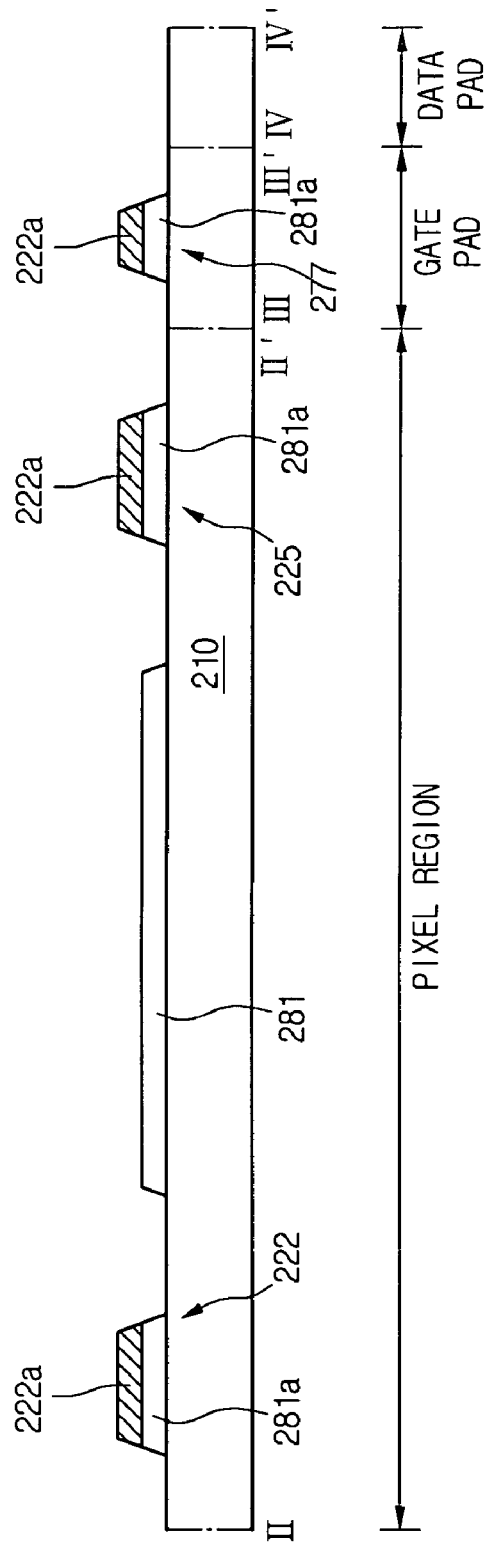

Referring first to FIG. 5A, a layer of transparent conductive material 280 and a non-transparent conductive layer 222a are sequentially stacked on a substrate 210. As shown in FIG. 5B, using a first mask process the stacked transparent conductive and non-transparent conductive layers 280 and 222a are patterned to form a gate line 221 and a gate electrode 222 having transparent electrode patterns 281a and a non-transparent conductive layer 222a that are stacked. A portion of the non-transparent conductive layer 222a is removed so that a pixel electrode 281 formed of a transparent conductive material is formed.

The transparent conductive material may be one selected from the group consisting of ITO, IZO, and indium-tin-zinc-oxide (ITZO). The non-transparent conductive layer 222a can be formed of one material selected from the group consisting of Cu, Al, AlNd, Mo, Cr, Ti, Ta, and MoW.

The first mask process will be described in detail.

The first mask process may use a diffraction mask or a half-tone mask. A first photoresist layer 290 is formed on a substrate in which the transparent conductive material and the gate metal layer are sequentially stacked, and one of the diffraction mask and the half-tone mask is aligned on the substrate.

The diffraction mask and the half-tone mask include a transmission region completely transmitting light, a blocking region completely blocking light, and a semi-transmissive region (when using light diffraction, partial transmission of light occurs where light passes through a grating in the diffraction mask).

The first photoresist layer 290 is exposed and developed using the diffraction mask or the half-tone mask, so that a first photoresist pattern with regions having differing thicknesses are formed.

Referring to FIG. 5B, when the transparent conductive material and the gate metal layer are patterned through an etching process that uses the first photoresist pattern having regions of differing thicknesses having as a mask, the gate line 221, the gate electrode 222, and the gate pad 277 in which the transparent electrode pattern 281a and the non-transparent conductive layer 222a are stacked, and portions of the non-transparent conductive layer 222a are removed so that the pixel electrode 281 formed of a transparent conductive material is formed.

Figure 5C:
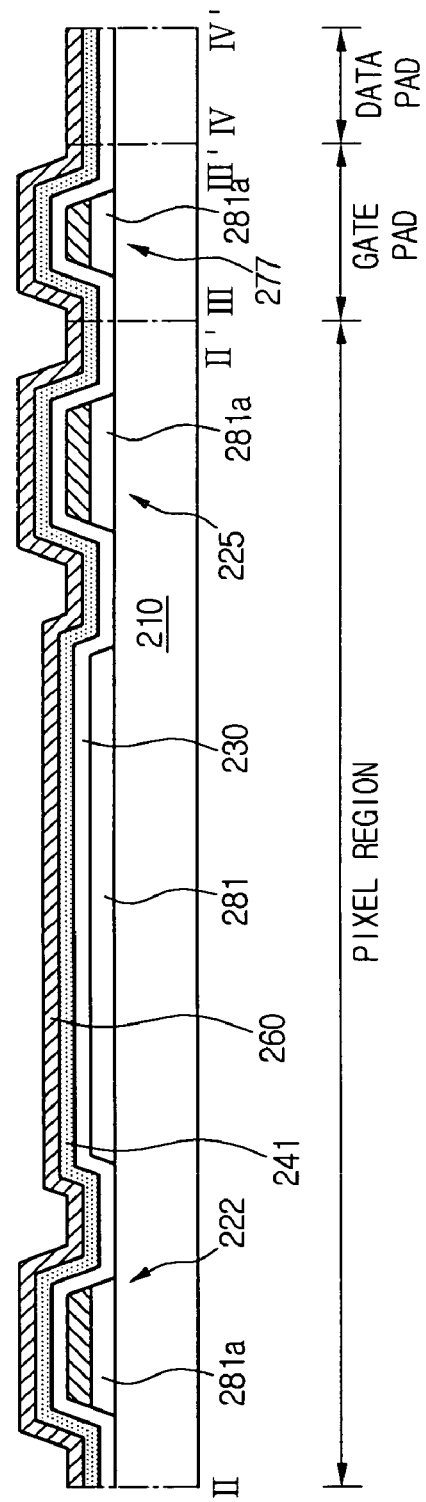

Subsequently, as illustrated in FIG. 5C, a gate insulation layer 230, a semiconductor layer 241, and a data metal layer 260 are sequentially formed on the substrate 210 on which the gate line 221 and the pixel electrode 281 are formed. A passivation layer may be formed on the data metal layer 260.

Here, the semiconductor layer 241 has a structure in which a semiconductor layer formed of an amorphous silicon (a-Si) layer and a semiconductor layer formed by implanting impurity ions are sequentially stacked.

As illustrated in FIGS. 5D to 5I, the semiconductor layer 241 and the data metal layer 260 are patterned using a second mask process to form TFTs.

Figure 5D:
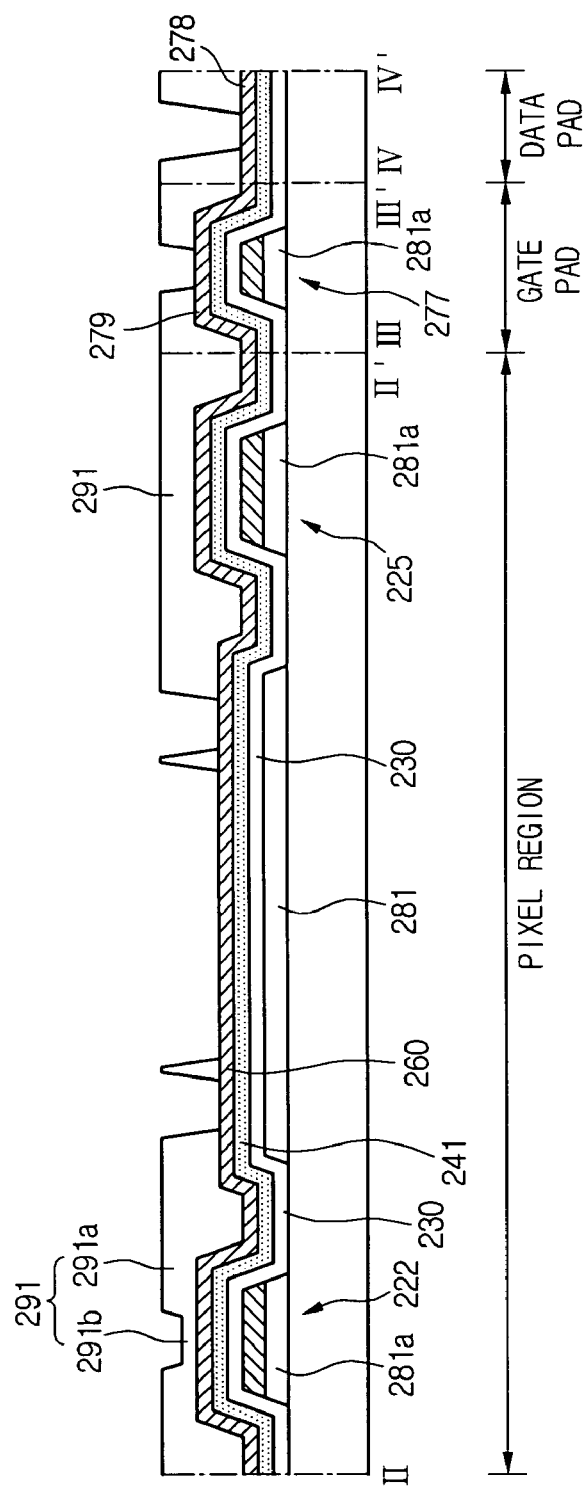
Figure 5E:
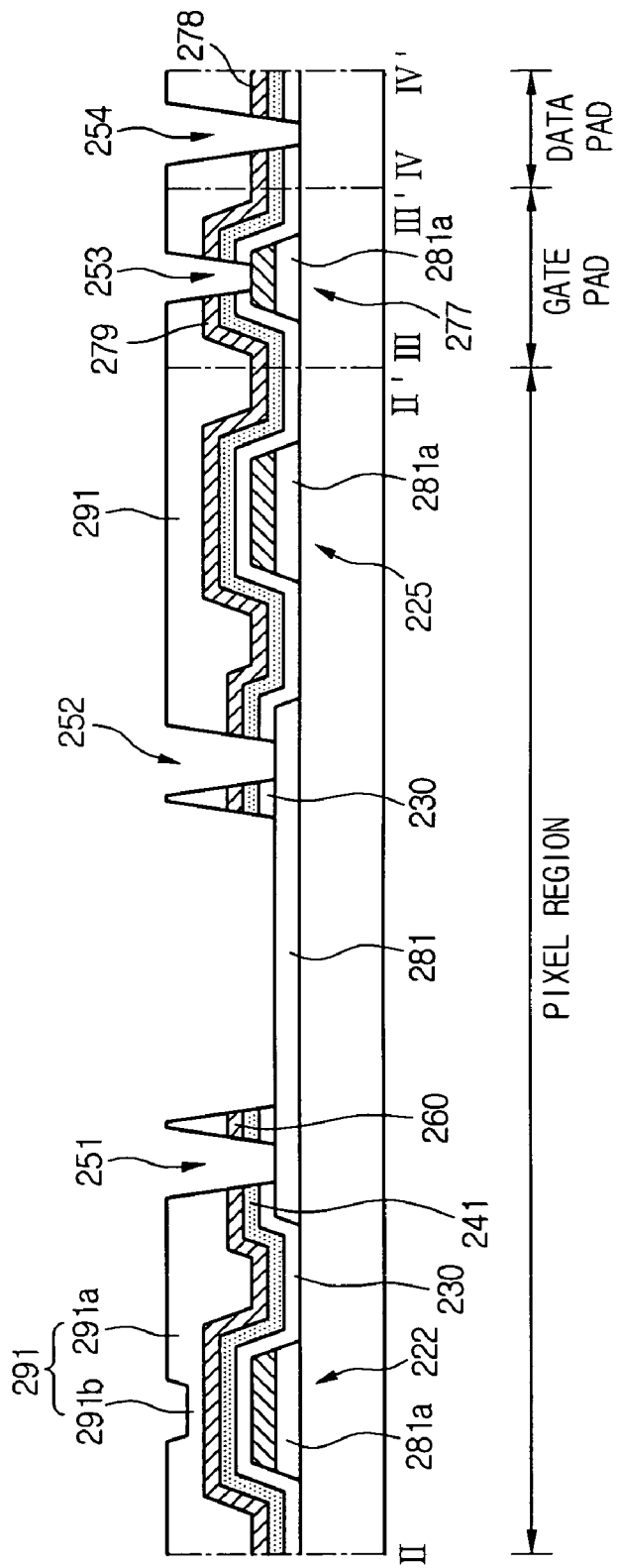

First, as illustrated in FIG. 5D and FIG. 5E, a second photoresist layer 291 is formed on the substrate 210 including the gate insulation layer 230, the semiconductor layer 241, and the data metal layer 260. The second photoresist layer is patterned using a diffraction mask or a half-tone mask, so that a second photoresist pattern 291 having areas of differing thickness is formed.

Details of the use of the diffraction mask or the half-tone mask to form the second photoresist pattern 291 can be understood by referring to the above description of the first mask process.

The second photoresist pattern 291 includes a region 291a having a first thickness and a region 291b having a second thickness (the first thickness being greater than the second thickness) and exposes the drain contact hole 251, the capacitor contact hole 252, the pixel electrode 281, the gate pad contact hole 253, the data pad contact hole 254.

Portions of the data metal layer 260, the semiconductor layer 241, and the gate insulation layer 230 exposed through the drain contact hole 251, the capacitor contact hole 252, the pixel electrode 281, the gate pad contact hole 253, and the data pad contact hole 254 are etched using the second photoresist pattern 291 as a mask.

The data metal layer 260 and the semiconductor layer 241 are patterned to form a data line 261 crossing the gate line 221, a source electrode 262 and a drain electrode 263 (not spaced from the source electrode 262) extending from the data line 261, a capacitor electrode 265 formed on portions of the gate lines 221 and the pixel electrode 281, a data pad 278 formed at one end of the data line 261, and semiconductor layer patterns and data metal layer patterns 279 formed in an island shape on the gate pad 277.

A portion of the drain electrode 263 extends onto the pixel electrode 281 to form a drain contact hole 251 exposing a predetermined portion of the pixel electrode 281.

The capacitor electrode 265 overlaps a portion of the pixel electrode 281 with the gate insulation layer 230 interposed, and includes a capacitor contact hole 252 exposing a portion of the pixel electrode 281.

The semiconductor layer patterns and the data metal layer patterns 279 formed in an island shape on the gate pad 277 include a gate pad contact hole 253 exposing a predetermined portion of the gate pad 277 with the gate insulation layer 230 interposed.

The data pad 278 includes a data pad contact hole 254 exposing a predetermined portion of the substrate 210.

More than a single drain contact hole 251, the capacitor contact hole 252, the gate pad contact hole 253, and the data pad contact hole 254 can be provided.

The surface of the second photoresist layer may be treated with a plasma ashing to improve adhesion between the second photoresist layer 291 and a contact electrode layer 255 such as a transparent conductive material to be formed on the second photoresist layer 291 as described hereinafter. During the plasma treatment a portion of the surface of the second photoresist layer 291 is slightly etched to remove a polymer layer formed on the second photoresist layer 291. An etching step using oxygen (O) and fluorine (F) can create a thin polymer layer on the surface of the second photoresist layer 291. The polymer layer is formed by a reaction between C atoms from the second photoresist layer 291 and F from the etching gas. The plasma treatment may be performed after a step for etching the data metal layer, the semiconductor layer 241 and the gate insulation layer 230 using the second material layer 291 as a mask.

Figure 5F:
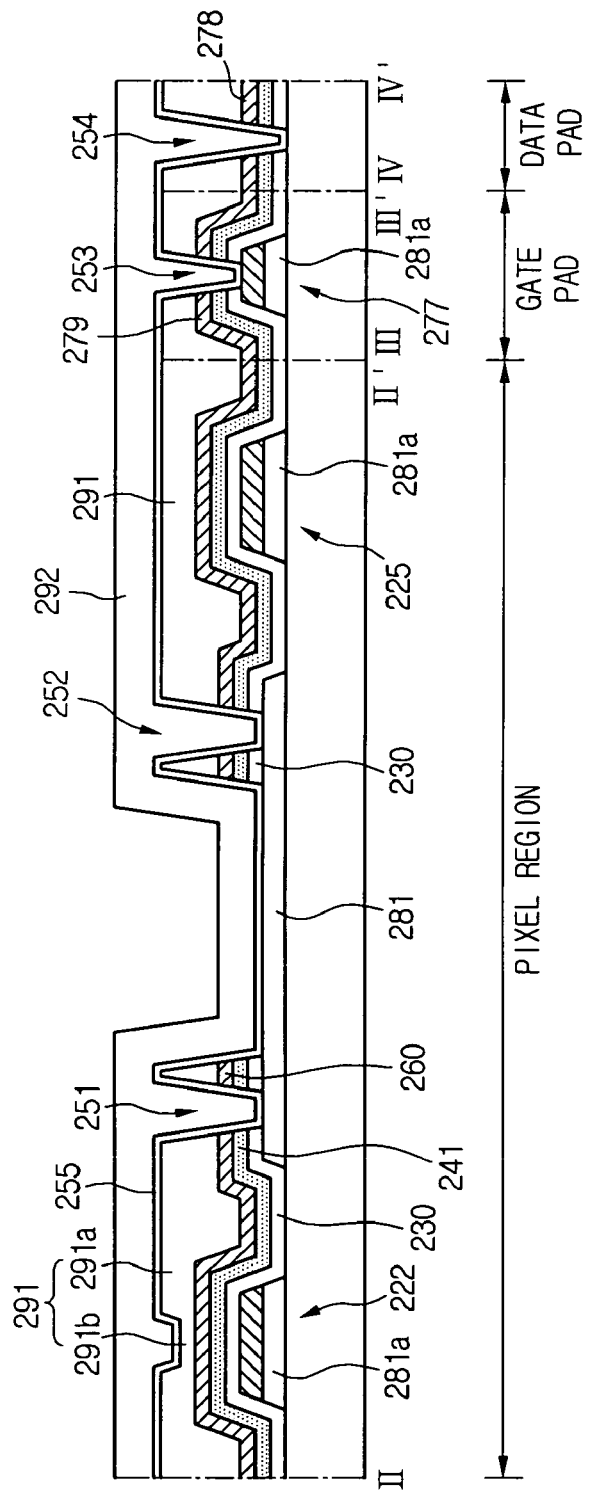

Subsequently, referring to FIG. 5F, the contact electrode layer 255 is formed on the substrate 210, and a third photoresist layer 292 is formed on the contact electrode layer 255. The third photoresist layer 292 may have a thickness having a range from about 1 μm to about 3 μm.

The contact electrode layer 255 may be formed of a transparent conductive material such as ITO, IZO and a metal such as at least one selected from the group consisting of Mo, Ti, Ti alloy.

The transparent conductive material contacts the exposed portions of the pixel electrode 281, the gate pad 277, the substrate 210 via the drain contact hole 251, the capacitor contact hole 252, the gate pad contact hole 253, and the data pad contact hole 254.

Figure 5G:
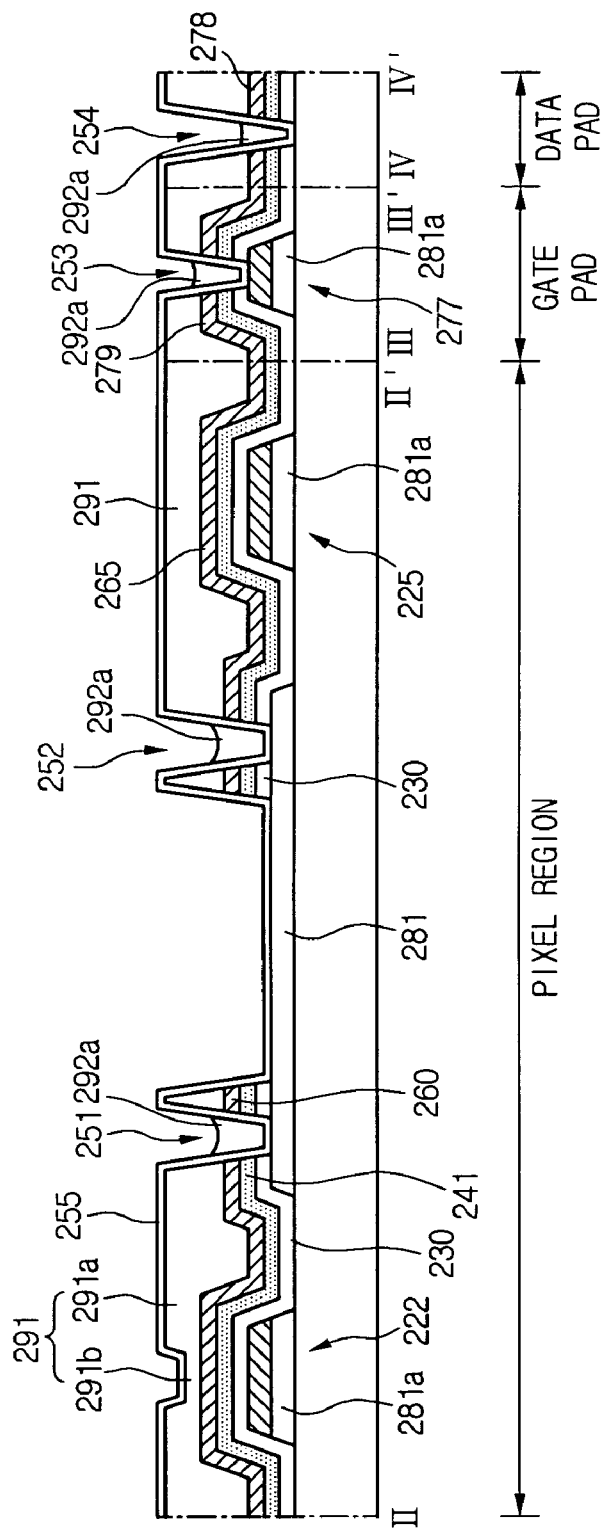

As illustrated in FIG. 5G, the third photoresist layer 292 is ashed after which only the portions of third photoresist patterns 292a that are formed in narrow holes such as the drain contact hole 251, the capacitor contact hole 252, the gate pad contact hole 253, and the data pad contact hole 254 remain with other portions of the third photoresist patterns 292a being removed.

Figure 5H:
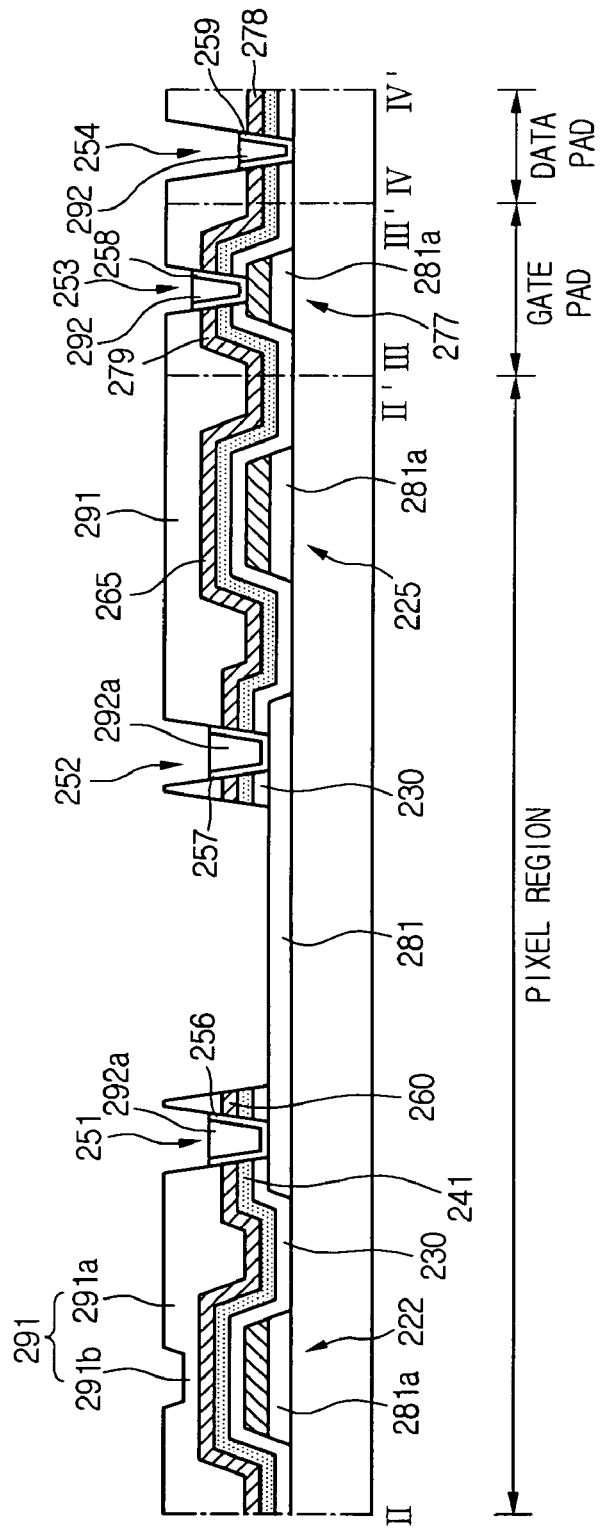

Subsequently, as illustrated FIG. 5H, a portion of the transparent conductive material 255 exposed through the ashed third photoresist layer 292 is etched.

During the etching process, a drain contact electrode 256, a capacitor contact electrode 257, a gate pad contact electrode 258, and a data pad contact electrode 259 are formed in the drain contact hole 251, the capacitor contact hole 252, the gate pad contact hole 253, and the data pad contact hole 254, respectively, using portions of the third photoresist patterns 292a that are formed in narrow holes such as the drain contact hole 251, the capacitor contact hole 252, the gate pad contact hole 253, and the data pad contact hole 254.

The drain electrode 263 side-contacts the pixel electrode 281 via the drain contact hole 251 passing through the gate insulation layer 230. At this point, the pixel electrode 281 and the drain electrode 263 side-contact the drain contact electrode 256 via the drain contact hole 251.

The pixel electrode 281 side-contacts the capacitor electrode 265 via the capacitor contact hole 252 passing through the gate insulation layer 230 and the semiconductor layer 241. The pixel electrode 281 and the capacitor electrode 265 side-contact a capacitor contact electrode 257 via the capacitor contact hole 252.

A storage capacitor is formed between the capacitor electrode 265 and a capacitor lower electrode 225 including an extended region of the gate line.

The gate pad 277 side-contacts the semiconductor layer 241 and the data metal layer 260 via the gate pad contact electrode 258 formed inside the gate pad contact hole 253.

The data pad 278 includes a data pad contact electrode 259 formed inside the data pad contact hole 254 to side-contact the data metal layer 260.

Figure 5I:
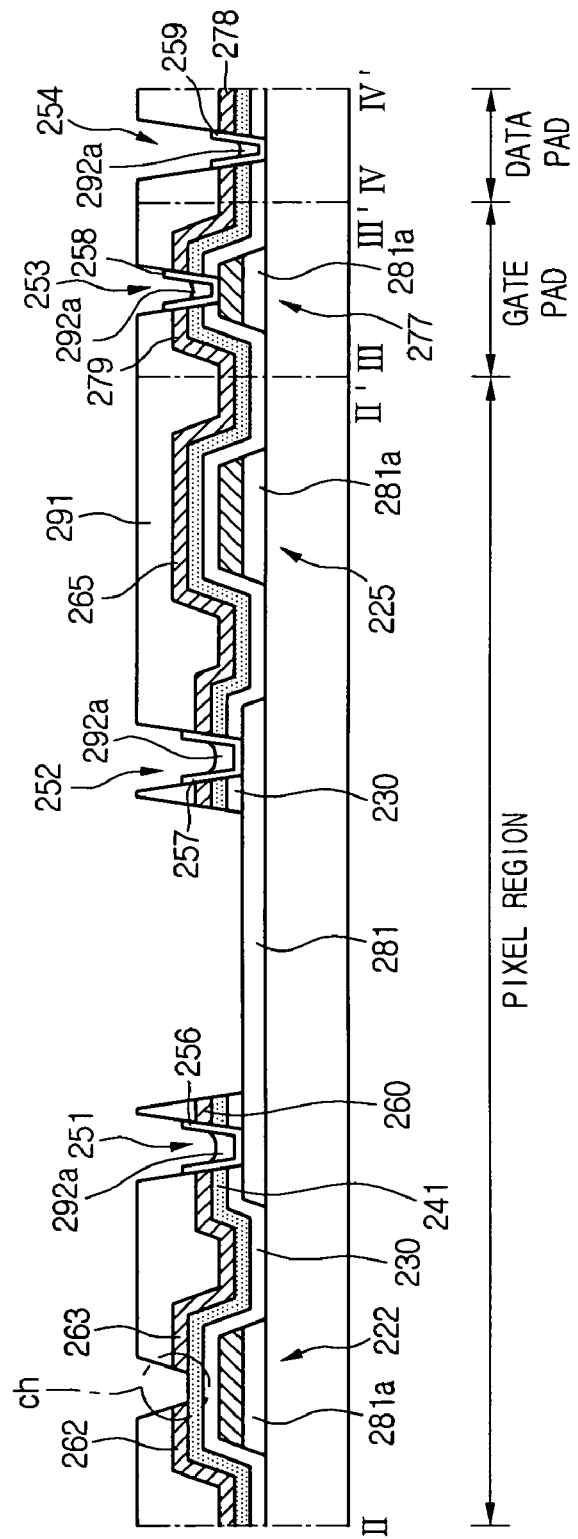

Next, as shown in FIG. 5I, the second photoresist pattern 291 having areas of differing thickness is ashed to remove the region 291b having a second thickness, so that the data metal layer 260 between the source and drain electrodes 262 and 263 may be etched to expose a channel region of the semiconductor layer 241.

A channel is formed by removing the impurity-doped semiconductor layer of the semiconductor layer 241.

Figure 5J:
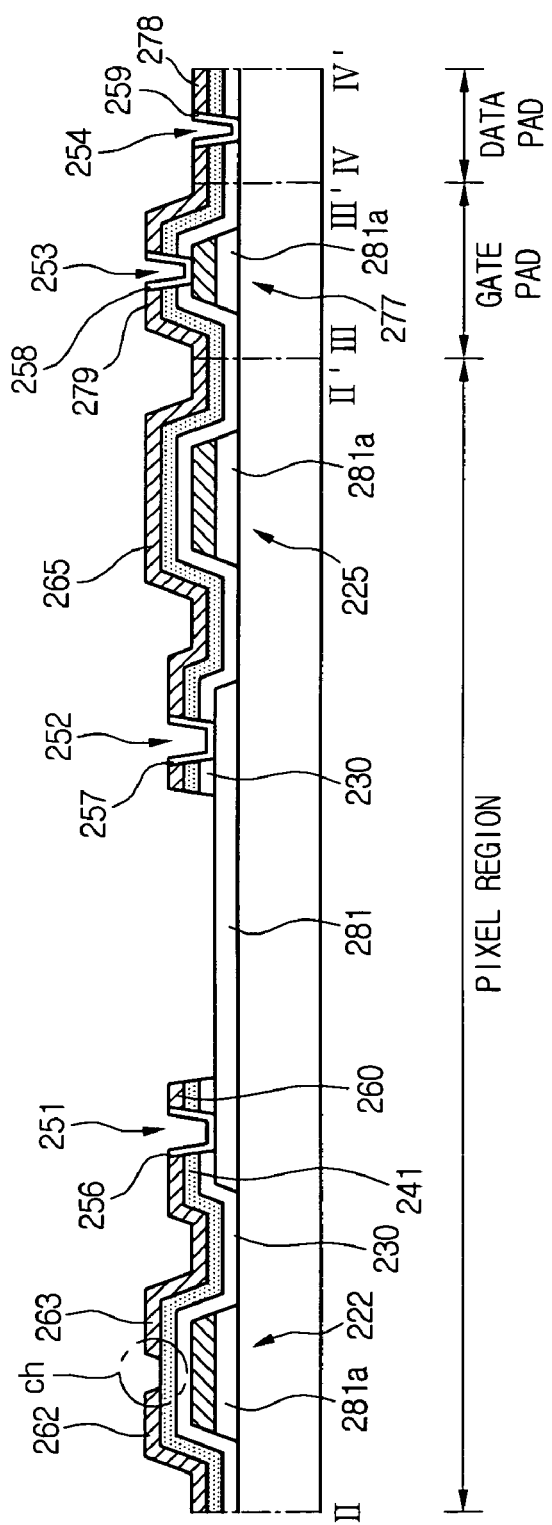

Subsequently, as illustrated in FIG. 5J, the second and third photoresist patterns 291a and 292a are removed.

Figure 5K:
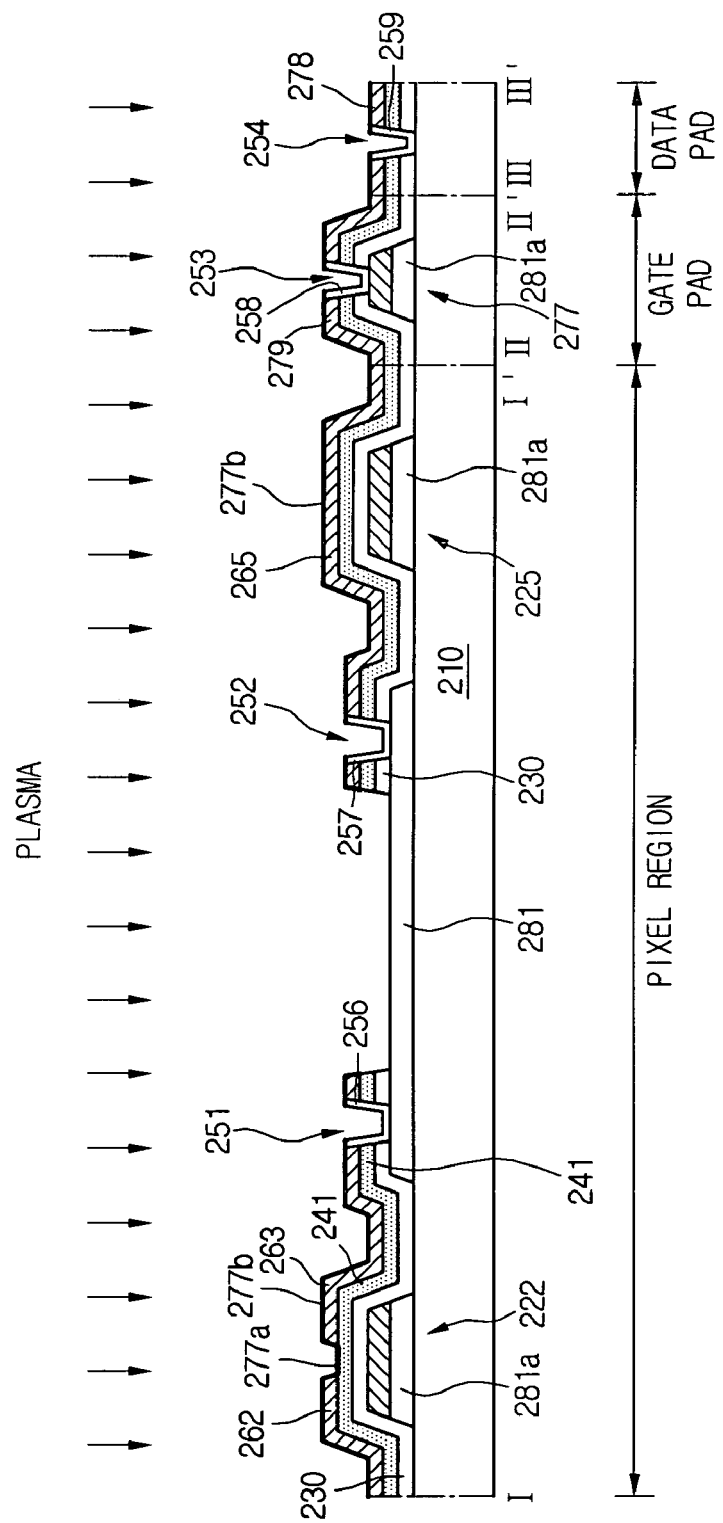

Finally, as illustrated in FIG. 5K, a gas plasma process is performed on the substrate 210. At this point, the exposed surface of the semiconductor layer 241 located in the channel region is exposed to an $O_x$ (e.g., $O_2$) or $N_x$ (e.g., $N_2$) plasma to allow $O_x$ or $N_x$ in an ionized state to react with Si contained in the semiconductor layer to form a channel passivation layer 277a of one of $SiO_2$ and $SiN_x$ on the portion of the semiconductor layer located in the channel region.

The channel passivation layer 277a protects an active layer of the channel region from being damaged.

By preventing damage, the channel passivation layer 277a can prevent defects in the LCD device and improves image quality.

In addition, metal of the source electrode 262, the drain electrode 263, the gate pad 277, the data pad 278, and the gate line 221 are exposed to gas plasma in an ionized state provide an oxidation layer 277b, which serves as a passivation layer.

Therefore, according to an embodiment of the present invention, a separate passivation layer for an array substrate may not be formed, and instead the oxide layer 277b is formed when the channel passivation layer 277a is formed to provide a passivation layer. By avoiding forming a separate passivation layer for the array substrate, separate equipment and material are not required allowing manufacturing costs to be are reduced and a slim LCD device to be realized.

As described above, since an array substrate for an LCD device according to an embodiment of the present invention can be manufactured using only two mask processes, manufacturing yield can be improved and manufacturing costs can be reduced.

In an array substrate for an LCD device according to the present invention, a channel passivation layer of TFTs may be formed to eliminate or reduce defects and to improve the image quality for the LCD device.

As describe above, in a manufacturing process according to an embodiment of the present invention a simplified process for manufacturing an array substrate for an LCD device uses only two masks to improve manufacturing yield and reduce manufacturing costs by reducing the number of masks.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing an array substrate for an LCD device, the method comprising:

forming a transparent conductive layer on a substrate;
forming a non-transparent conductive layer on the transparent conductive layer;
patterning the transparent conductive layer and the non-transparent conductive layer to form a gate line, a gate electrode, a gate pad, and a transparent pixel electrode, wherein the gate line, the gate electrode, and the gate pad each include portions of the non-transparent conductive layer and the transparent conductive layer;
sequentially forming a gate insulation layer, a semiconductor layer, and a data metal layer on the substrate;
forming a second photoresist pattern having areas of differing thickness on the data metal layer;
patterning the gate insulation layer, the semiconductor layer and the data metal layer to form a data line, a data pad, a capacitor electrode and at least one contact hole by using the second photoresist pattern as a mask;
forming a contact electrode layer and a third photoresist layer on the second photoresist pattern and ashing the third photoresist to form an ashed third photoresist pattern inside the at least one contact hole;
etching the contact electrode layer to form a contact electrode in each of the at least one contact hole using the ashed third photoresist pattern;
ashing the second photoresist pattern to expose a portion of the data metal layer and etching the exposed portion of the data metal layer to form a channel between a source electrode connected to the data line and a drain electrode using the second photoresist pattern; and
removing the ashed second photoresist pattern and the ashed third photoresist pattern.

2. The method according to claim 1, wherein patterning the transparent conductive layer and the non-transparent conductive layer further comprises:

forming a first photoresist pattern having areas of differing height on the non-transparent conductive layer; and
patterning the transparent conductive layer and the non-transparent conductive layer using the first photoresist pattern to form the gate line, the gate electrode, the gate pad, and the transparent pixel electrode.

3. The method according to claim 1, further comprising:

ashing the surface of the second photoresist pattern to enhance adhesive properties of the second photoresist pattern.

4. The method according to claim 1, wherein the at least one contact hole includes first, second, third, and fourth contact holes.

5. The method according to claim 4, wherein the first, second, third and fourth contact holes are formed in the drain electrode, the capacitor electrode, the gate pad, the data pad, respectively, by etching the data metal layer, the semiconductor layer, and the gate insulation layer.

6. The method according to claim 4, wherein the respective contact electrodes of the first, second, third, and fourth contact holes respectively side-contact the gate pad, the data pad, the capacitor electrode, and the drain electrode.

7. The method according to claim 1, wherein forming the data line, the data pad, and the capacitor electrode includes stacking the semiconductor layer and a data metal layer; and wherein the source electrode and the data electrode are formed by stacking the semiconductor layer and a data metal layer.

8. The method according to claim 1, wherein stacked patterns of the semiconductor layer and the data metal layer are formed on the gate pad in an island shape with the gate insulation layer interposed.

9. The method according to claim 1, further comprising, after etching the exposed portion of the data metal layer to form a channel, plasma-processing the channel to form a channel passivation layer made of one of a silicon oxide layer and a silicon nitride layer on a surface of the channel.

10. The method according to claim 9, wherein the plasma-processing of the channel to form the channel passivation layer comprises forming a metal oxide layer on surfaces of the source electrode, the drain electrode, the gate pad, the data pad, and the gate line.

11. The method according to claim 1, wherein the drain electrode contacts the pixel electrode via the contact electrode formed inside the first contact hole.

12. The method according to claim 1, wherein the capacitor electrode contacts the pixel electrode via the contact electrode formed inside the second contact hole.

13. The method according to claim 1, wherein the contact electrode formed inside the third contact hole contacts the gate pad.

14. The method according to claim 1, wherein the contact electrode formed in the fourth contact hole contacts the data pad.

* * * * *